(12) United States Patent  
Zehedi et al.

(10) Patent No.: US 8,547,953 B2  
(45) Date of Patent: Oct. 1, 2013

(54) COMPACT SPECIFICATION OF DATA ALLOCATIONS

(75) Inventors: Sina Zehedi, San Diego, CA (US); Yoav Nebat, San Diego, CA (US); Dennis Connors, San Diego, CA (US)

(73) Assignee: Wi-Lan, Inc., Ottawa (CA)

( * ) Notice: Subject to any disclaimer, the term of this patent is extended or adjusted under 35 U.S.C. 154(b) by 1185 days.

(21) Appl. No.: 12/202,187

(22) Filed: Aug. 29, 2008

(65) Prior Publication Data

US 2009/0147871 A1  Jun. 11, 2009

Related U.S. Application Data

(60) Provisional application No. 61/007,360, filed on Dec. 11, 2007, provisional application No. 61/019,572, filed on Jan. 7, 2008, provisional application No. 61/024,507, filed on Jan. 29, 2008, provisional application No. 61/060,117, filed on Jun. 9, 2008.

(51) Int. Cl.  
*H04L 27/28* (2006.01)

(52) U.S. Cl.  
USPC ........................................ 370/343

(58) Field of Classification Search  
USPC ........................................ 370/343  
See application file for complete search history.

(56) References Cited

U.S. PATENT DOCUMENTS

| | | | |
|---|---|---|---|
| 5,546,409 A | 8/1996 | Karasawa | |
| 5,826,018 A | 10/1998 | Vixie et al. | |
| 5,983,383 A | 11/1999 | Wolf | |
| 6,021,433 A | 2/2000 | Payne et al. | |
| 6,085,253 A | 7/2000 | Blackwell et al. | |
| 6,928,521 B1 | 8/2005 | Burton et al. | |
| 7,031,249 B2 | 4/2006 | Kowalski | |
| 7,058,027 B1 | 6/2006 | Alessi et al. | |
| 7,343,540 B2 | 3/2008 | Khermosh et al. | |
| 7,464,319 B2 | 12/2008 | Budge et al. | |
| 7,644,343 B2 | 1/2010 | Gubbi et al. | |
| 7,660,245 B1 | 2/2010 | Luby | |
| 7,856,026 B1 | 12/2010 | Finan et al. | |

(Continued)

FOREIGN PATENT DOCUMENTS

| EP | 1 718 096 | 11/2006 |
|---|---|---|
| EP | 1718096 | 11/2006 |

(Continued)

OTHER PUBLICATIONS

Jianfeng Wang et al., "System Architecture and Cross-Layer Optimization of Video Broadcast Over WiMAX", IEEE Journal on Selected Areas in Communications, vol. 25, No. 4, May 2007, pp. 712-721.

(Continued)

*Primary Examiner* — Sulaiman Nooristany  
(74) *Attorney, Agent, or Firm* — Volpe and Koenig, P.C.

(57) ABSTRACT

The subject matter disclosed herein provides a mechanism for numbering OFDMA symbols in data regions of OFDMA frames. The method may include assigning, based on a pattern vector, one or more numbers to one or more symbols of a time diversity interval. Moreover, the one or more numbered symbols may be assigned to one or more segments. The pattern vector is then provided to a client station to enable the client station to access, based on the numbered one or more symbols, at least one of the segments. Related systems, apparatus, methods, and/or articles are also described.

14 Claims, 7 Drawing Sheets

(56) References Cited

U.S. PATENT DOCUMENTS

| | | | |
|---|---|---|---|
| 7,877,663 | B2 | 1/2011 | Vesma et al. |
| 2002/0147954 | A1 | 10/2002 | Shea |
| 2003/0081564 | A1 | 5/2003 | Chan |
| 2003/0207696 | A1 | 11/2003 | Willenegger et al. |
| 2003/0226092 | A1 | 12/2003 | Kim et al. |
| 2004/0090932 | A1 | 5/2004 | Wei et al. |
| 2004/0100937 | A1 | 5/2004 | Chen |
| 2004/0199847 | A1 | 10/2004 | Calabro et al. |
| 2004/0199850 | A1 | 10/2004 | Yi et al. |
| 2004/0243913 | A1 | 12/2004 | Budge et al. |
| 2005/0005189 | A1 | 1/2005 | Khermosh et al. |
| 2005/0088986 | A1 | 4/2005 | Sun et al. |
| 2005/0135308 | A1 | 6/2005 | Vijayan et al. |
| 2005/0265168 | A1 | 12/2005 | Kopf |
| 2006/0013168 | A1 | 1/2006 | Agrawal et al. |
| 2006/0077890 | A1 | 4/2006 | Suryavanshi et al. |
| 2006/0239264 | A1* | 10/2006 | Kang et al. ............ 370/390 |
| 2006/0239265 | A1 | 10/2006 | Son et al. |
| 2006/0248430 | A1 | 11/2006 | Iancu et al. |
| 2006/0268726 | A1 | 11/2006 | Alamaunu et al. |
| 2007/0004437 | A1 | 1/2007 | Harada et al. |
| 2007/0019717 | A1* | 1/2007 | Laroia et al. ............ 375/222 |
| 2007/0101228 | A1 | 5/2007 | Vesma et al. |
| 2007/0165578 | A1 | 7/2007 | Yee et al. |
| 2007/0230351 | A1 | 10/2007 | Dang |
| 2007/0240027 | A1 | 10/2007 | Vesma et al. |
| 2007/0253367 | A1 | 11/2007 | Dang et al. |
| 2007/0268933 | A1 | 11/2007 | Wu et al. |
| 2008/0022345 | A1 | 1/2008 | Kim et al. |
| 2008/0052605 | A1 | 2/2008 | Luo et al. |
| 2008/0080474 | A1* | 4/2008 | Kitchin ............ 370/349 |
| 2008/0098283 | A1 | 4/2008 | Vayanos et al. |
| 2008/0114711 | A1 | 5/2008 | Nagaraj |
| 2008/0225819 | A1 | 9/2008 | Niu et al. |
| 2008/0282310 | A1 | 11/2008 | Koppelaar et al. |
| 2009/0034459 | A1* | 2/2009 | Shousterman et al. ....... 370/329 |
| 2009/0109890 | A1 | 4/2009 | Chow et al. |
| 2009/0150736 | A1 | 6/2009 | Nebat et al. |
| 2009/0177940 | A1 | 7/2009 | Guo et al. |
| 2009/0259920 | A1 | 10/2009 | Guo et al. |
| 2010/0115379 | A1 | 5/2010 | Gubbi et al. |
| 2010/0183077 | A1 | 7/2010 | Lee et al. |
| 2011/0235724 | A1 | 9/2011 | Kim et al. |

FOREIGN PATENT DOCUMENTS

| | | |
|---|---|---|
| KR | 10-1995-0010768 | 9/1995 |
| KR | 10-0371157 | 3/2003 |
| KR | 10-2005-0114162 | 12/2005 |
| KR | 10-2006-011864 | 10/2006 |
| KR | 10-2006-0064677 | 6/2007 |
| KR | 10-2007-0068456 | 6/2007 |
| WO | 2005/022814 | 3/2005 |

OTHER PUBLICATIONS

Jenkac et al., "Flexible outer Reed-Solomon coding on RLC layer for MBMS over GERAN," Vehicular Technology Conference. vol. 5, pp. 2777-2791 (May 2004).

Agashe et al., "CDMA2000 High Rate Broadcast Packet Data Air Interface Design," IEEE Comm. Magazine, pp. 83-89 (Feb. 2004).

Form PCT/ISA/220, Notification of Transmittal of the International Search Report and the Written Opinion of the International Searching Authority, or the Declaration, mailed May 18, 2009.

Form PCT/ISA/220, Notification of Transmittal of the International Search Report and the Written Opinion of the International Searching Authority, or the Declaration, mailed Apr. 30, 2009.

Form PCT/ISA/220, Notification of Transmittal of the International Search Report and the Written Opinion of the International Searching Authority, or the Declaration, mailed Apr. 20, 2009.

Form PCT/ISA/220, Notification of Transmittal of the International Search Report and the Written Opinion of the International Searching Authority, or the Declaration, mailed May 26, 2009.

Form PCT/ISA/220, Notification of Transmittal of the International Search Report and the Written Opinion of the International Searching Authority, or the Declaration, mailed Jun. 24, 2009 for corresponding PCT Application PCT/US2008/086103.

Form PCT/ISA/220, Notification of Transmittal of the International Search Report and the Written Opinion of the International Searching Authority, or the Declaration, mailed May 26, 2009 for corresponding PCT Application PCT/US2008/086278.

IEEE 802.16 Broadband Wireless Access Working Group, IEEE 802.16lpc-00/33, "FEC Performance of Concatenated Reed Solomon and Convolutional Coding with Interleaving," (Jun. 8, 2000).

IEEE 802.16 Broadband Wireless Access Working Group, IEEE 802.16lmaint-08/293, "Optional outer-coded data mode for MBS," (Sep. 11, 2008).

Jenkac et al., "Flexible outer Reed-Solomon coding on RLC layer for MBMS over GERAN," Vehicular Technology Conference. vol. 5, pp. 2777-2781 (May 2004).

Patent Cooperation Treaty (PCT) International Search Report, PCT/US2008/085984, Notification of Transmittal of the International Search Report and the Written Opinion of the International Searching Authority, or the Declaration, mail date Mar. 27, 2009, 11 pages.

Pursley et al., "Variable-Rate Coding for Meteor-Burst Communications," IEEE Trans. on Comm., vol. 37, No. 11 (Nov. 1989).

Qualcomm, "MBMS design consideration," 3GPP TSG WGIT, R1-02-1099 (Jan. 7-10, 2003).

Wang et al., "System Architecture and Cross-Layer Optimization of Video Broadcast over WiMAX," IEEE Journal on Selected Areas in Communications, vol. 25, No. 4 pp. 712-721 (May 2007).

Wei et al., "Application of NB/WB AMR Speech Codes in the 30-kHz TDMA System," IEEE Trans. on Comm., vol. 6, No. 6 (Nov. 2004).

* cited by examiner

COMPACT SPECIFICATION OF DATA ALLOCATIONS

CROSS REFERENCE TO RELATED APPLICATION

This application claims the benefit under 35 U.S.C. §119 (e) of the following provisional applications, all of which are incorporated herein by reference in their entirety: U.S. Ser. No. 61/007,360, entitled "Multimedia Broadcast System," filed Dec. 11, 2007; U.S. Ser. No. 61/019,572, entitled "Multimedia Broadcast System," filed Jan. 7, 2008; U.S. Ser. No. 61/024,507, entitled "Multimedia Broadcast System," filed Jan. 29, 2008; and U.S. Ser. No. 61/060,117, entitled "Multimedia Broadcast System," filed Jun. 9, 2008.

FIELD

The subject matter described herein relates to wireless communications.

BACKGROUND

Multicast and broadcast service (MBS) refers generally to sending information to a plurality of receivers. Macrodiversity MBS is a specific type of transmission, in which a plurality of base stations transmit synchronously. When using macrodiversity (MD), a plurality of base stations synchronously transmit at about the same frequency, using about the same waveform, and using about the same framing parameters. Macrodiversity is also referred to as a single frequency network (SFN).

At a receiver, such as a client station, macrodiversity provides a so-called "macrodiversity gain" by combining the synchronous broadcasts transmitted by the base stations—providing at the receiver the macrodiversity gain resulting from the combined waveforms. IEEE-802.16 is just one of the standards that support both MBS and macrodiversity. IEEE 802.16 refers to one or more specifications, such as the Institute of Electrical and Electronic Engineers (IEEE) Standard for Local and metropolitan area networks, Part 16: Air Interface for Fixed Broadband Wireless Access Systems, 1 Oct. 2004, the IEEE Standard for Local and metropolitan area networks, Part 16: Air Interface for Fixed and Mobile Broadband Wireless Access Systems, 26 Feb. 2006, and subsequent revisions and additions to those standards.

FIG. 7 depicts an example of OFDMA frames 710A-D used in connection with a MBS transmission consistent with IEEE 802.16. The OFDMA frames 710A-D include regions, such as MBS regions 712A-D, transmitted in a downlink from a base station to a client station. These regions represent one or more OFDMA symbols (or simply symbols) carrying the content (e.g., packets) of the multicast and broadcast service. When macrodiversity is used, the base stations synchronously transmit an MBS region (e.g., the first symbol of an MBS region is transmitted at about the same time at each of the base stations). In accordance with IEEE 802.16, the MBS regions 712A-D are described by MBS maps 714A-D. The client station uses information in the MBS map as well as other management messages sent from the base station to the client station to decode the data content in the MBS regions to form packets for use at the client station.

SUMMARY

The subject matter disclosed herein provides a mechanism for numbering OFDMA symbols in data regions, such as multicast and broadcast service (MBS) regions of OFDMA frames.

In one aspect, there is provided a method. The method may include assigning, based on a pattern vector, one or more numbers to one or more symbols of a time diversity interval. Moreover, the one or more numbered symbols may be assigned to one or more segments. The pattern vector is then provided to a client station to enable the client station to access, based on the numbered one or more symbols, at least one of the segments.

In another aspect, there is provided a method. The method may include receiving, at a client station, a pattern vector; determining, based on the pattern vector, a symbol number indicating a start of a segment; and receiving the segment based on the determined symbol number, the segment including a group of numbered orthogonal frequency division multiple access (OFDMA) symbols carrying a stream of packets.

In another aspect, there is provided a system. The system may include means for assigning, based on a pattern vector, one or more numbers to one or more symbols of a time diversity interval; means for assigning the one or more numbered symbols to one or more segments; and means for providing to a client station the pattern vector to enable the client station to access, based on the numbered one or more symbols, at least one of the segments.

In yet another aspect, there is provided a system. The system may include means for receiving, at a client station, a pattern vector; means for determining, based on the pattern vector, a symbol number indicating a start of a segment; and means for receiving the segment based on the determined symbol number, the segment including a group of numbered orthogonal frequency division multiple access (OFDMA) symbols carrying a stream of packets.

In yet another aspect, there is provided a computer-readable medium containing instructions to configure a processor to perform a method including assigning, based on a pattern vector, one or more numbers to one or more symbols of a time diversity interval; assigning the one or more numbered symbols to one or more segments; and providing to a client station the pattern vector to enable the client station to access, based on the numbered one or more symbols, at least one of the segments.

In yet another aspect, there is provided a computer-readable medium containing instructions to configure a processor to perform a method including receiving, at a client station, a pattern vector; determining, based on the pattern vector, a symbol number indicating a start of a segment; and receiving the segment based on the determined symbol number, the segment including a group of numbered orthogonal frequency division multiple access (OFDMA) symbols carrying a stream of packets.

In still yet another aspect, there is provided a system. The system may include a numbering module configured to assign, based on a pattern vector, one or more numbers to one or more symbols of a time diversity interval. Moreover, the numbering module may be configured to assign the one or more numbered symbols to one or more segments. Furthermore, the numbering module may be configured to provide the pattern vector to enable a client station to access, based on the numbered one or more symbols, at least one of the segments.

In still yet another aspect, there is provided a system. The system may include a client station. The system may also include a numbering module configured to receive, at a client station, a pattern vector. Moreover, the numbering module may be configured to determine, based on the pattern vector, a symbol number indicating a start of a segment. Furthermore, the numbering module may be configured to receive the segment based on the determined symbol number, the segment including a group of numbered orthogonal frequency division multiple access (OFDMA) symbols carrying a stream of packets.

Variations of the above aspects may include one or more of the following features. The pattern vector may use one or more values defining one or more widths of one or more multicast and broadcast service regions of a time diversity interval. The pattern vector may also use a first value representing a first width of a first multicast and broadcast service region, a second value representing a second width of a second multicast and broadcast service region, a third value representing a third width of a third multicast and broadcast service region, the first, second, and third multicast and broadcast service regions included within a time diversity interval. The assignment, based on the pattern vector, may include numbering each of the orthogonal frequency division multiple access (OFDMA) symbols of multicast and broadcast service regions included within a time diversity interval, and the assignment may be made without regard to boundaries associated with multicast and broadcast service regions. A segment may include a group of numbered orthogonal frequency division multiple access (OFDMA) symbols carrying a stream of packets within one or more multicast and broadcast service regions. A segment may be accessed, based on the pattern vector, by receiving a stream of packets carried by the at least one segment.

The details of one or more variations of the subject matter described herein are set forth in the accompanying drawings and the description below. Features and advantages of the subject matter described herein will be apparent from the description and drawings, and from the claims.

Figure 1:
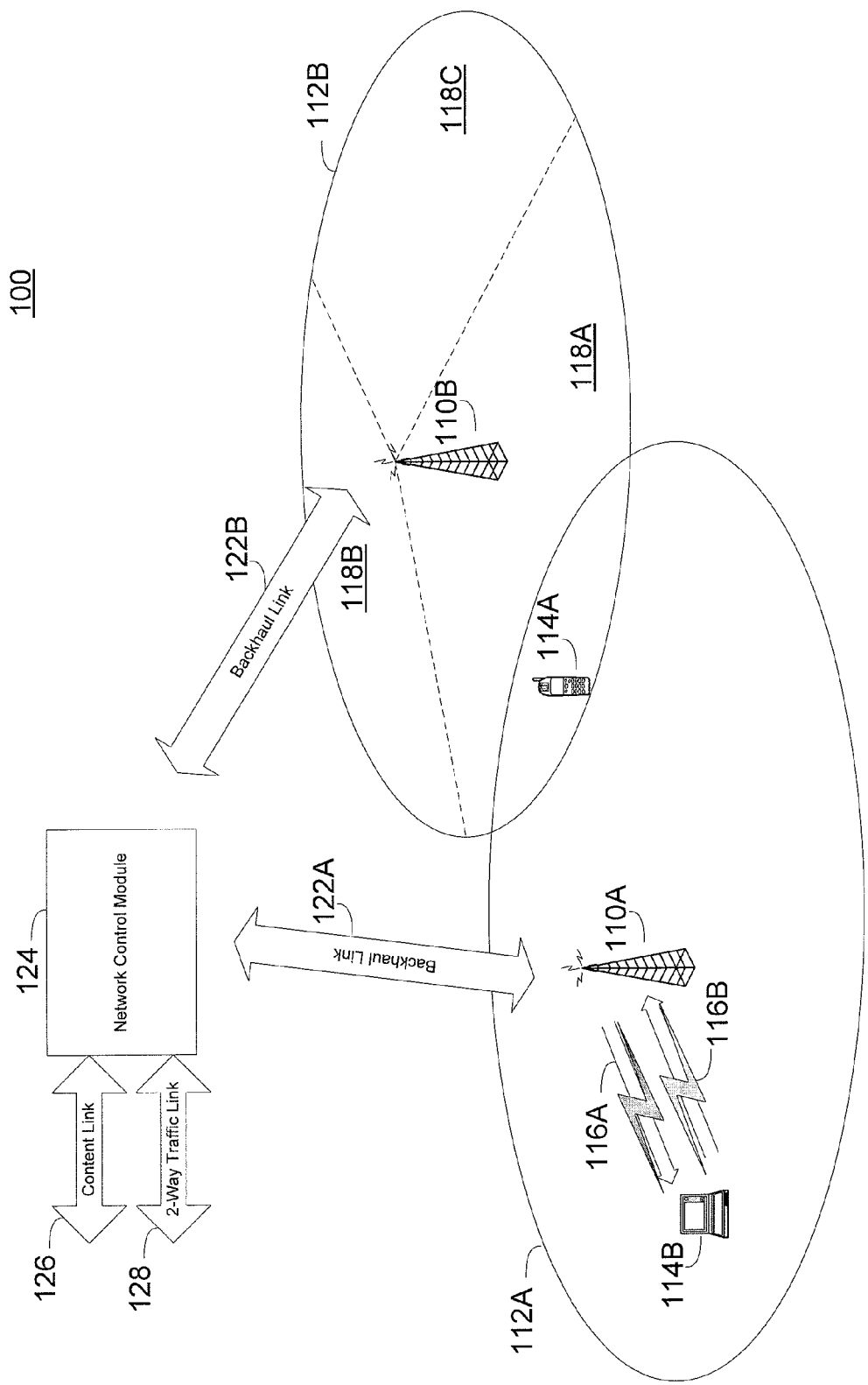
FIG. 1 depicts a block diagram of a network including client stations and base stations.

Like labels are used to refer to same or similar items in the drawings.

DETAILED DESCRIPTION

The subject matter described herein relates to a numbering system that consecutively numbers the symbols of multiple data regions. In some implementations, the numbering system may consecutively number the OFDMA symbols of a data region of an OFDMA data frame. For exemplary purposes, the data region will be assumed to be a data region for transmitting multicast and/or broadcast data, which will be referred to herein as a multicast and broadcast service (MBS) region. However, the ideas discussed herein are equally applicable to other types of data regions and data frames.

Moreover, the numbering system may define a pattern vector (also referred to as a pattern), the elements of which compactly define the width of the MBS regions and how to number OFDMA symbols in the MBS regions. The base station provides numbering system information, such as the pattern vector, to a client station to enable the client station to access, based on the pattern vector, OFDMA symbols in the MBS regions. Further description of the numbering system including the pattern vector is provided below after the following general overview of the network 100 of FIG. 1.

FIG. 1 is a simplified functional block diagram of an embodiment of a wireless communication system 100. The wireless communication system 100 includes a plurality of base stations 110A and 110B, each supporting a corresponding service or coverage area 112A and 112B. The base stations are capable of communicating with wireless devices within their coverage areas. For example, the first base station 110A is capable of wirelessly communicating with a first client station 114A and a second client station 114B within the coverage area 112A. The first client station 114A is also within the coverage area 112B and is capable of communicating with the second base station 110B. In this description, the communication path from the base station to the client station is referred to as a downlink 116A and the communication path from the client station to the base station is referred to as an uplink 116B.

Although for simplicity only two base stations are shown in FIG. 1, a typical wireless communication system 100 includes a much larger number of base stations. The base stations 110A and 110B can be configured as cellular base station transceiver subsystems, gateways, access points, radio frequency (RF) repeaters, frame repeaters, nodes, or any wireless network entry point.

The base stations 110A and 110B can be configured to support an omni-directional coverage area or a sectored coverage area. For example, the second base station 110B is depicted as supporting the sectored coverage area 112B. The coverage area 112B is depicted as having three sectors, 118A, 118B, and 118C. In typical embodiments, the second base station 110B treats each sector 118 as effectively a distinct coverage area.

Although only two client stations 114A and 114B are shown in the wireless communication system 100, typical systems are configured to support a large number of client stations. The client stations 114A and 114B can be mobile, nomadic, or stationary units. The client stations 114A and 114B are often referred to as, for example, mobile stations, mobile units, subscriber stations, wireless terminals, or the like. A client station can be, for example, a wireless handheld device, a vehicle mounted device, a portable device, client premise equipment, a fixed location device, a wireless plug-in accessory or the like. In some cases, a client station can take the form of a handheld computer, notebook computer, wireless telephone, personal digital assistant, wireless email device, personal media player, meter reading equipment or the like, and may include a display mechanism, microphone, speaker and memory.

In a typical system, the base stations 110A and 110B also communicate with each other and a network control module 124 over backhaul links 122A and 122B. The backhaul links 122A and 122B may include wired and wireless communication links. The network control module 124 provides network administration and coordination as well as other overhead, coupling, and supervisory functions for the wireless communication system 100.

In some embodiments, the wireless communication system 100 can be configured to support both bidirectional communication and unidirectional communication. In a bidirectional network, the client station is capable of both receiving information from and providing information to the wireless communications network. Applications operating over the bidirectional communications channel include traditional voice and data applications. In a unidirectional network, the client station is capable of receiving information from the wireless communications network but may have limited or no ability to provide information to the network. Applications operating over the unidirectional communications channel include broadcast and multicast applications. In one embodiment, the wireless system 100 supports both bidirectional and unidirectional communications. In such an embodiment, the network control module 124 is also coupled to external entities via, for example, content link 126 (e.g., a source of digital video and/or multimedia) and two-way traffic link 128.

The wireless communication system 100 can be configured to use Orthogonal Frequency Division Multiple Access (OFDMA) communication techniques. For example, the wireless communication system 100 can be configured to substantially comply with a standard system specification, such as IEEE 802.16 and its progeny or some other wireless standard such as, for example, WiBro, WiFi, Long Term Evolution (LTE), or it may be a proprietary system. The subject matter described herein is not limited to application to OFDMA systems or to the noted standards and specifications. The description in the context of an OFDMA system is offered for the purposes of providing a particular example only.

In some embodiments, downlink 116A and uplink 116B each represent a radio frequency (RF) signal. The RF signal may include data, such as voice, video, images, Internet Protocol (IP) packets, control information, and any other type of information. When IEEE-802.16 is used, the RF signal may use OFDMA. OFDMA is a multi-user version of orthogonal frequency division multiplexing (OFDM). In OFDMA, multiple access is achieved by assigning to individual users groups of subcarriers (also referred to as tones) and/or groups of symbol periods. The subcarriers are modulated using BPSK (binary phase shift keying), QPSK (quadrature phase shift keying), QAM (quadrature amplitude modulation), and carry OFDMA symbols including data coded using a forward error-correction code. The OFDMA symbols thus comprise one or more subcarriers.

The subject matter described herein relates to a numbering system that consecutively numbers the OFDMA symbols of a plurality of data regions. For example, the numbering system may consecutively number the OFDMA symbols of multicast and broadcast service (MBS) regions, although other types of regions may be used as well.

Moreover, each of the data regions, such as the MBS regions, may be assigned a particular width measured as a function of OFDMA symbols. The widths of the data regions (or MBS regions) may be specified by a pattern vector. The pattern vector may be defined as follows: $(w_1, w_2, \ldots w_K)$, wherein K represents the number of elements (e.g., widths) in the pattern vector, $w_1$ represents the width in OFDMA symbols of a first MBS region in a given interval, such as a time diversity interval (described further below), $w_2$ represents the width in OFDMA symbols of the second MBS region in the interval, and so forth until $w_k$, which represents the width in OFDMA symbols of the $K^{th}$ MBS region in the time diversity interval. For example, for a pattern vector (10,5,7), the MBS regions in consecutive frames of a time diversity interval would be assigned widths of 10 OFDMA symbols, 5 OFDMA symbols, 7 OFDMA symbols, and then repeat, such that the next three MBS regions would have widths of 10 OFDMA symbols, 5 OFDMA symbols, and 7 OFDMA symbols, and so forth. The pattern vector serves thus to compactly define the widths of the regions, such as the MBS regions, which are typically non-contiguous (e.g., other data is transmitted between transmission of the MBS regions). Moreover, the pattern vector defines how to assign the consecutive numbers (also referred to herein as symbol numbers) to each of the MBS regions, as described further below.

Figure 2:
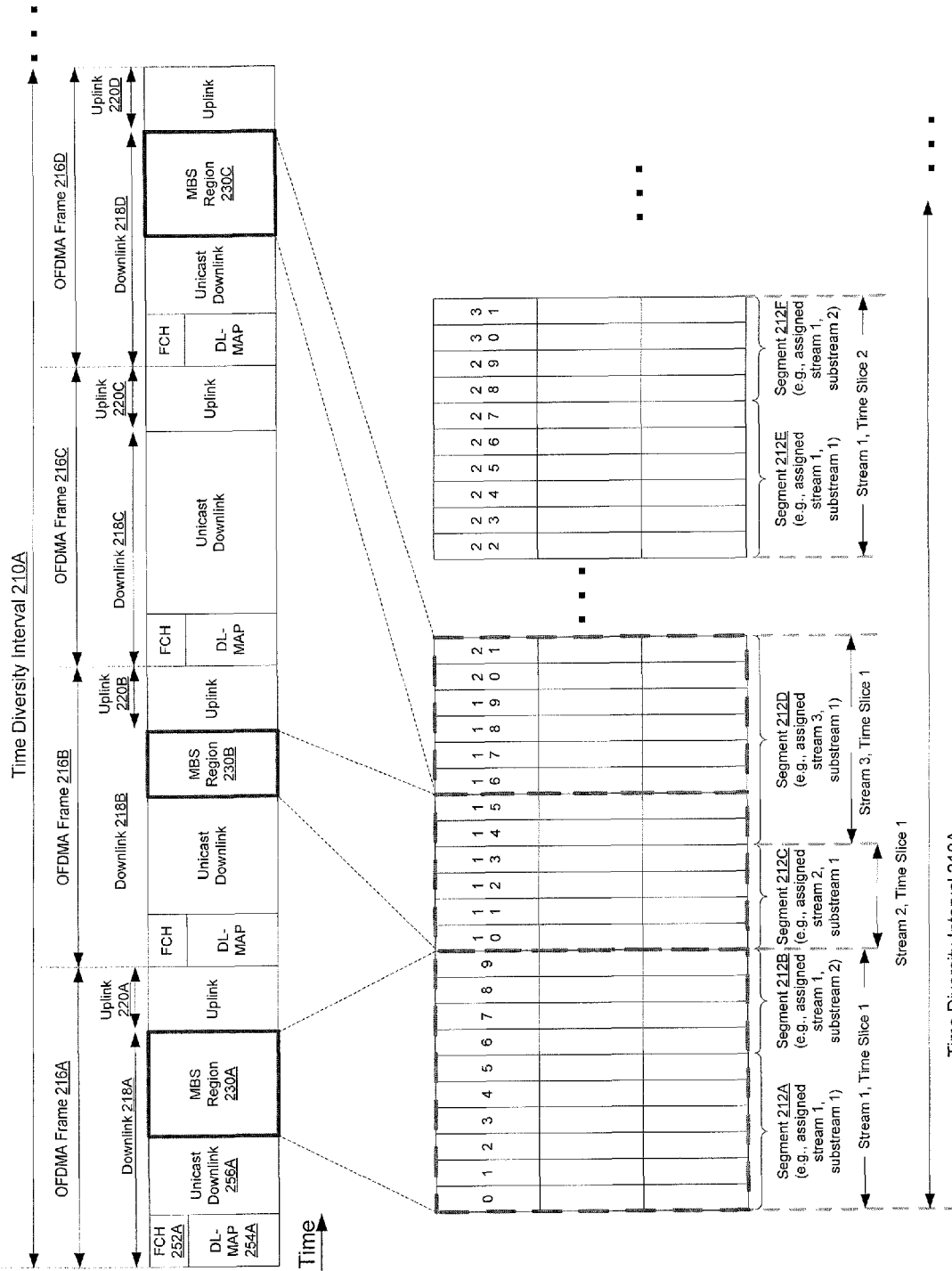
FIG. 2 depicts a block diagram of a numbering system applied across MBS regions.

FIG. 2 depicts a time interval, such as a time diversity interval 210A, consistent with some embodiments of the invention. The time diversity interval 210A includes one or more OFDMA frames, such as OFDMA frames 216A-D. Each of the OFDMA frames represents a region over which one or more OFDMA symbols are transmitted. In some embodiments, the time diversity interval (TDI) is implemented as a time interval, during which a group of consecutive OFDMA frames are transmitted. An OFDMA frame may include a portion of the frame for downlink transmissions, as depicted at downlinks 218A-D, and a portion for uplink transmissions, as depicted at uplinks 220A-D. A downlink, such as downlink 218A, may include a frame control header (FCH) 252A, downlink (DL) map (DL-MAP) 254A, a unicast downlink region 256A, and a region for transmitting multicast and/or broadcast data, such as MBS region 230A. The MBS regions 230A-C can be transmitted by a plurality of base stations using macrodiversity (MD). Other portions of the frames, such as the frame control headers, downlink maps, unicast downlinks, and uplinks can be transmitted in a non-macrodiversity manner. IEEE 802.16 is an example of a standard that supports the transmission of OFDMA frames 216A-D as well as macrodiversity transmissions of the MBS regions. It should be again noted that although the present embodiment is discussed in reference to OFDMA frames including MBS regions in accordance with IEEE 802.16, in other embodiments other frame types and data regions may be used, such as for example, frames in accordance with Long Term Evolution (LTE).

The MBS regions may carry content from a service. A service may provide a stream of packets corresponding to content, such as a video stream of packets consistent with, for example, H.264 (i.e., International Telecommunications Union, H.264: Advanced video coding for generic audiovisual services video stream of packets, November 2007). The stream may be inserted into the data regions, such as MBS regions, for transmission by one or more base stations to one or more client stations. Moreover, the transmission of the MBS regions may use macrodiversity. Furthermore, the transmission may be in a zone, such as a geographic area. To illustrate using a broadcast television analogy, the zone may be the area of San Diego, and the streams may each correspond to a channel of content available in San Diego. As such, a user at a client station may change streams (e.g., channels) to change service content at the client station.

A stream may include one or more substreams. A substream represents a portion of the stream. For example, a stream of H.264 video may be divided into two substreams, so that one substream includes important content requiring more error correction and/or more robust modulation than the other substream.

A substream may be composed of several segments. The term "segment" refers to an allocation of OFDMA symbols that spans zero or more OFDMA frames and resides in one or more data regions, such as the MBS regions. Each segment is thus a set of OFDMA symbols consecutively numbered using the numbering system described herein (e.g., with respect to FIG. 2 below). Furthermore, the segment may be specified with a starting OFDMA symbol number using the numbering system described herein.

FIG. 2 also depicts a numbering system being assigned to the OFDMA symbols across OFDMA frames and, in particular, across MBS regions of different OFDMA frames. For example, the OFDMA symbols of MBS region 230A are assigned symbol numbers 0-9, which corresponds to a width of 10 OFDMA symbols. The OFDMA symbols of MBS region 230B are assigned symbol numbers 10-15, which corresponds to a width of 6 OFDMA symbols. OFDMA frame 216C does not include an MBS region, which corresponds to a width of 0 OFDMA symbols. The OFDMA symbols of MBS region 230C are assigned symbol numbers 16-21, which corresponds to a width of 6 OFDMA symbols. Moreover, the pattern vector, in this example, corresponds to (10, 6, 0, 6). As such, the width of the next MBS regions would be 10 OFDMA symbols, followed by an MBS region having a width of 6 OFDMA symbols, and followed by a frame having no MBS region symbols, and then by another MBS region having a width of 6 OFDMA symbols. Thus, the pattern vector (10, 6, 0, 6) represents the width of the MBS regions and the period of repetition (in this example, a period of 4), after which, if the TDI contained more than 4 OFDMA frames, the widths in the pattern vector would repeat in subsequent MBS regions, until the last frame in the TDI.

FIG. 2 also depicts that symbol numbers are assigned to segments 212A-F. For example, symbol numbers 0-5 are assigned to segment 212A; segment 212B is assigned to symbol numbers 6-9; segment 212C is assigned to symbol numbers 10-13; segment 212D is assigned to symbol numbers 14-21; and so forth. The segments carry substreams (which are part of a stream as described above). For example, symbol numbers 0-5, which is assigned to segment 212A, carries content from stream 1 and substream 1, while symbol numbers 6-9, assigned to segment 212B, carries content from stream 1 and substream 2.

FIG. 2 further depicts that the assigned segment allocations associated with stream 1 and substreams 1 and 2 repeat at segments 212A-B, 212E-F, and so forth within a given time diversity interval, such as time diversity interval 210A. Specifically, the segments (including stream and substreams) are allocated to symbol numbers using segment patterns. These segment patterns may be a function of the pattern vector. Referring again to the previous example of the pattern vector (10, 6, 0, 6) and FIG. 2, symbol numbers 0-9 correspond to a segments including stream 1 substreams 1-2 (see segments 212A-B), and then the segment patterns repeat with a period (also referred to as a cycle) of 4 OFDMA frames, so that the segments including stream 1 substreams 1-2 also correspond to symbol numbers 22-31 (see segments 212E-F of time diversity interval 210A), and so forth at intervals of 4 OFDMA frames across the time diversity interval. The cycle (or period) of 4, which is equal to the period of the pattern vector is exemplary since other values may be used as the period. Thus, the segment pattern repeats at a period defined based on the pattern vector, which in this case is every 4 frames. Note that a segment pattern need not span the entire TDI. For example, the pattern may apply to a portion at the beginning of the TDI, at the end of the TDI, or to any other portion of the TDI.

Moreover, the segment pattern can be used for a given time diversity interval, and for that given time diversity interval, the allocation of segments to symbol numbers (i.e., the segment allocation) can be defined compactly by defining the segment pattern, which can repeat within that time diversity interval, as noted above. However, in some embodiments, the segment structure (which is defined by a pattern vector) for another, subsequent time diversity interval may be implemented independently (e.g., the subsequent time diversity interval may use a different pattern vector than the previous time diversity interval 210A). The subject matter described herein may thus provide a compact mechanism to define a segment structure (as well as a resulting allocation of segments to symbol numbers) using a pattern vector given the numbering system described herein. The numbering system may thus enable a client station to receive and decode a stream of interest across segments within a given time diversity interval based on the numbering system. For example, a client station interested in selecting stream 1, substreams 1 and 2 may receive and decode the symbols 0-9 and 22-31 across segments 212A-B and segments 212E-F.

In some embodiments, the above-described "pattern vector" defines the layout of the numbering system as well as the segment pattern used to allocate segments (including substreams and streams) to symbol numbers in a given time diversity interval (TDI). Moreover, the segment pattern may be used to compactly define the allocation to the given substream in the TDI. Although the above example provides a case of the pattern vector having a cycle of 4 frames and the segment pattern having a cycle (or period) of 4 frames, this is only exemplary since the segment pattern may have a cycle that is any multiple of the pattern vector (e.g., 8, 12, etc.). Moreover, in some embodiments, the segment pattern may have a cycle that is an not an integer multiple (e.g., ½, etc) of the pattern vector's length.

Figure 3:
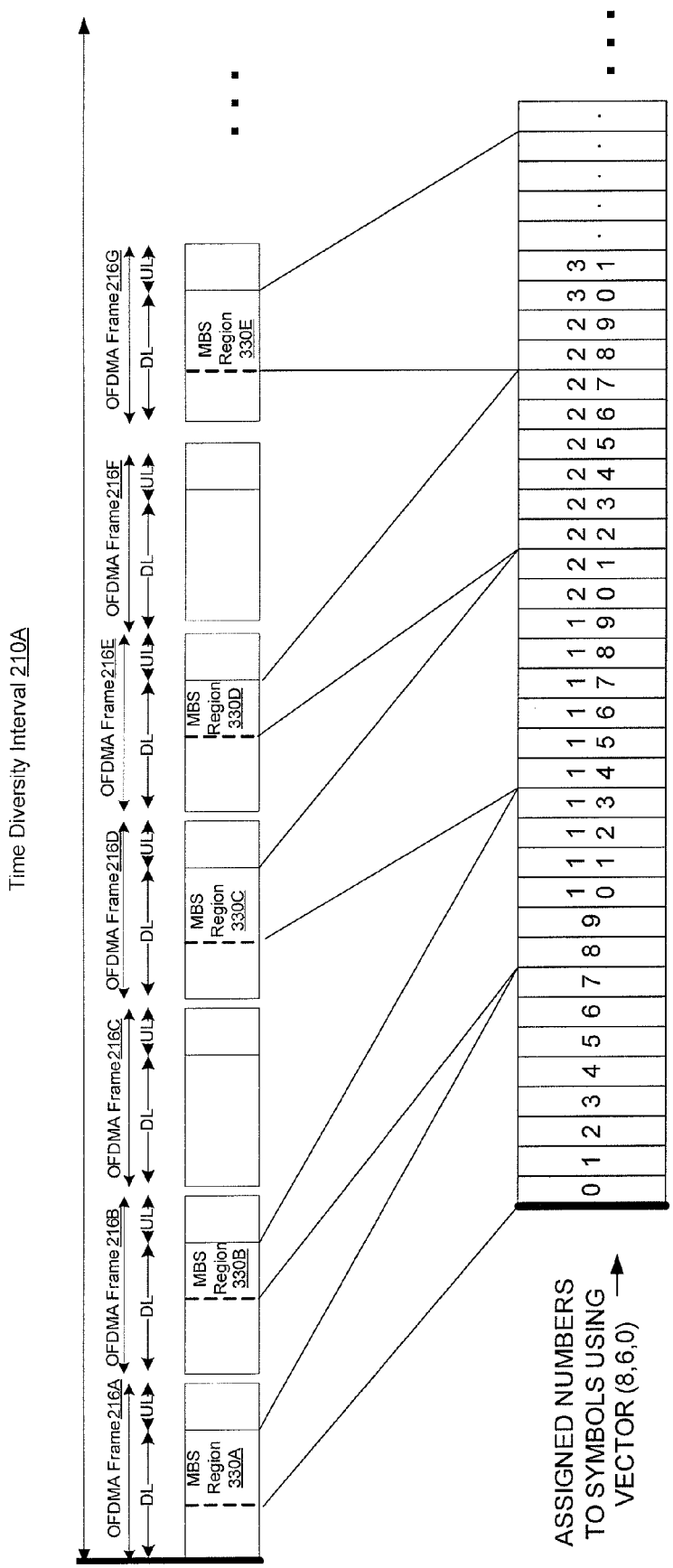
FIG. 3 depicts another block diagram of a numbering system applied across MBS regions.

FIG. 3 depicts the time diversity interval 210A depicted in FIG. 2. However, FIG. 3 depicts the numbering system assigned with a pattern vector of (8, 6, 0). For example, OFDMA frame 216A includes an MBS region 330A including symbol numbers 0-7, i.e., a width of 8 OFDMA symbols. OFDMA frame 216B includes an MBS region 330B including symbol numbers 8-13, i.e., a width of 6 OFDMA symbols, while OFDMA frame 216C does not include an MBS region, which corresponds to a width of zero (0). The pattern vector (also referred to as "pattern") would repeat in subsequent OFDMA frames and thus MBS regions, as depicted at FIG. 3.

Figure 4:
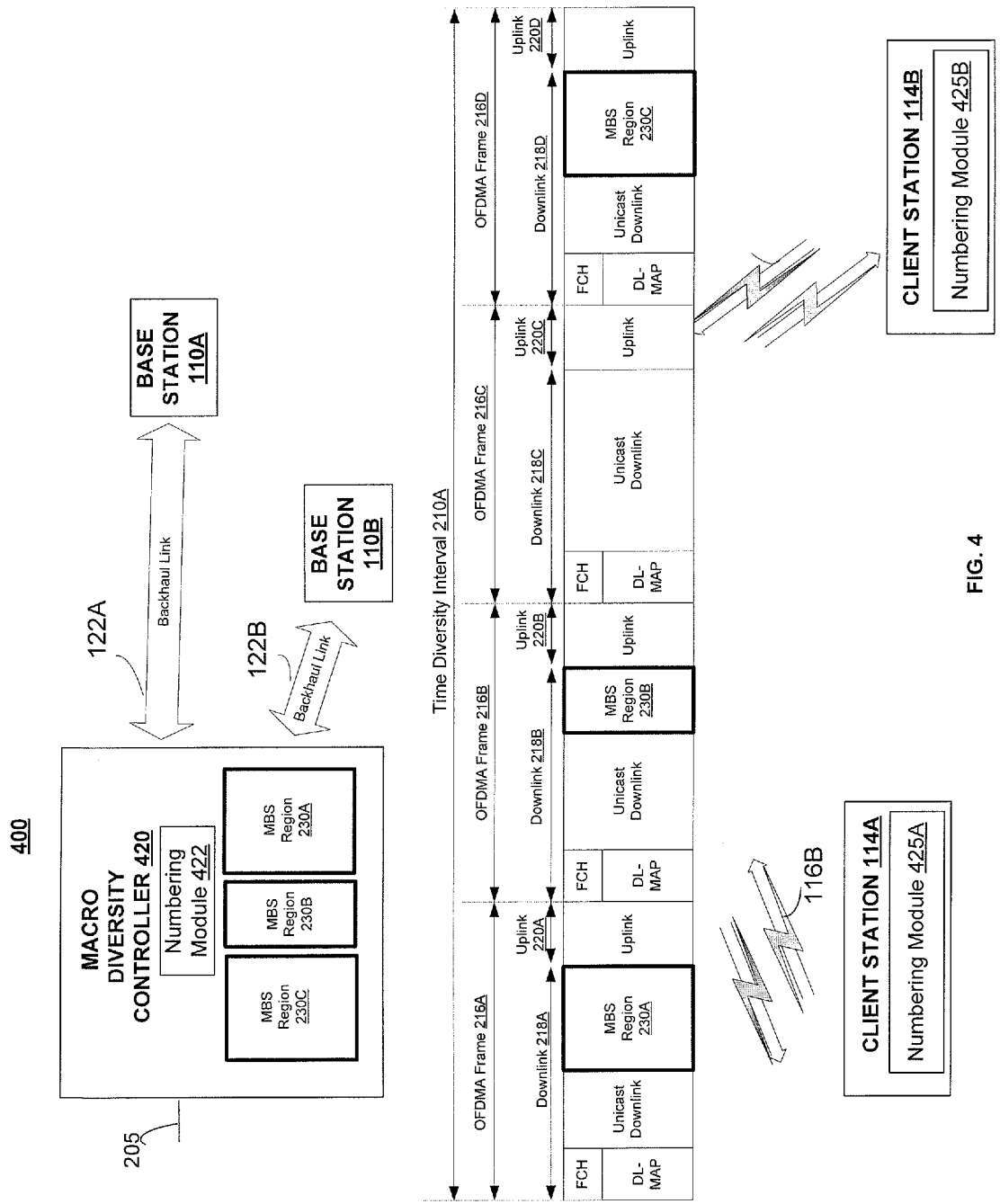
FIG. 4 depicts a block diagram of a network including a macrodiversity controller.

FIG. 4 depicts a macrodiversity system 400 including a macrodiversity controller 420, base stations 110A-B, and client stations 114A-B. Macrodiversity controller 420 further includes a numbering module 422 configured to number OFDMA symbols and provide a pattern vector to client stations, as described further below with respect to process 500 of FIG. 5. Client stations 114A-B further include numbering modules 425A-B to use the numbering system and pattern vector as described further below with respect to process 600 at FIG. 6. The macrodiversity controller 420 and, in particular, numbering module 422 assign, based on the pattern vector, the symbol numbers to the OFDMA symbols of the MBS regions. In some implementations, numbering module 422 provides the pattern vector so that the pattern vector can be included in a management message (e.g., an MBS map message or like management message), which may be transmitted to the client station as content in one or more of the MBS regions.

In some implementations, the macrodiversity controller 420 receives packets 205 including streams and substreams of content and inserts the packets 205 (as well as management messages, such as an MBS map message including the pattern vector) into one or more of the MBS regions 230A-C. The macrodiversity controller 420 provides the MBS regions 230A-C and schedules the MBS regions 230A-C for transmission at base stations 110A and 110B to achieve macrodiversity. To achieve macrodiversity, the macrodiversity controller 420 schedules the transmissions of the MBS regions 230A-C at base stations 110A and 110B, such that the transmissions are synchronous with respect to the same OFDMA frames (or MBS regions) being transmitted at about the same frequency, using about the same waveform (e.g., same modulation and coding scheme), and using about the same framing parameters (e.g., number of symbols in the OFDMA frame, length of OFDMA symbols, cyclic prefix, and the like). Each of the base stations 110A and 110B inserts MBS regions 230A-C into corresponding OFDMA frames 216A, B, and D, and then transmits (per the schedule determined by the macrodiversity controller) the OFDMA frames 216A-D, some of which include the MBS regions 230A-C, to client stations 114A-B. Although the MBS regions 230A-C are typically transmitted using macrodiversity, other portions of the OFDMA frames may be transmitted in a non-macrodiversity transmission. For example, each base station may transmit unique data using individual modulation and coding schemes in the portions of the OFDMA frame other than the MBS regions. Moreover, in some implementations, macrodiversity is not used at one or more of the base stations.

At the client stations, such as client stations 114A-B, macrodiversity provides a so-called "macrodiversity gain" by combining the synchronous broadcast from base stations 110A and 110B. In some implementations, macrodiversity provides enhanced SINR (signal to interference-plus-noise ratio) at the client station, when compared to a non-macrodiversity transmission. Moreover, the client stations 114A-B and, in particular, numbering modules 425A-B thus use the pattern vector received from the macrodiversity controller (and/or numbering module 422) to determine how to access streams and substreams carried in MBS regions 230A-C. When the pattern vector is included in an MBS region, the pattern vector is more likely to be received and decoded as a result of the macrodiversity gain, when compared to inserting the pattern vector in a non-macrodiversity region of the transmission, such as in the frame control header (FCH), downlink map (DL-MAP), or unicast downlink region.

Figure 5:
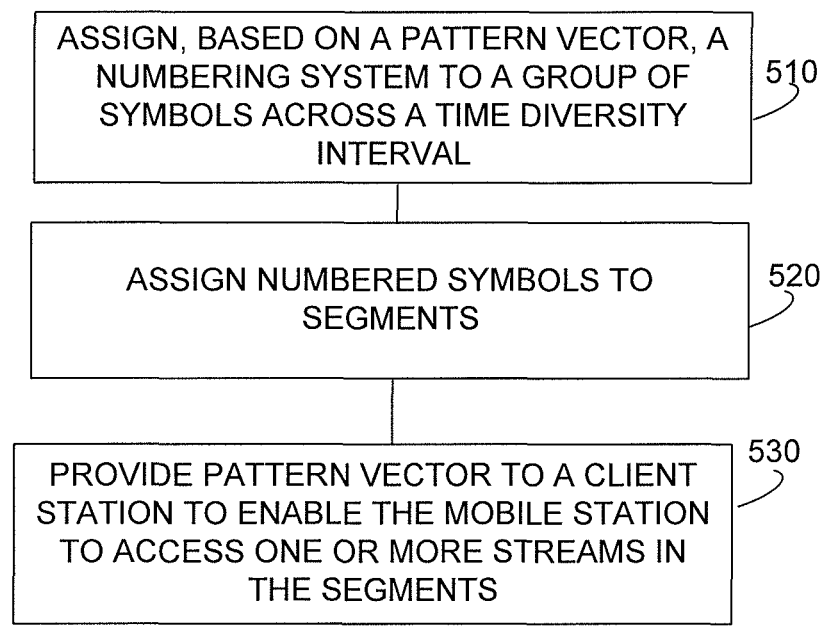
FIG. 5 depicts a process 500 for assigning, at a base station, the numbering system to OFDMA symbols.

FIG. 5 depicts a process 500 for assigning a numbering system to regions of a frame (e.g., assigning a consecutive numbering system to the OFDMA symbols of the MBS regions). The description of process 500 will refer to FIGS. 2-4 as well.

At 510, a numbering system may be assigned, based on a pattern vector, to a group of OFDMA symbols of MBS regions across a time diversity interval. At the numbering module 422 of the macrodiversity controller 420, the pattern vector may be used to determine the widths of the MBS regions. Referring to FIG. 3, given a starting location of a time diversity interval 210A and a pattern vector of (8, 6, 0), the first OFDMA frame 216A would include an MBS region 330A having a width of 8 OFDMA symbols, enabling a numbering of the symbols from 0-7. The next MBS region 330B would have a width of 6 OFDMA symbols, enabling a numbering of 8-13, and OFDMA frame 216C would have a width of zero OFDMA symbols, enabling no symbols in that frame to be numbered. As additional content is received via packets 205, numbering module 422 can continue to consecutively number the OFDMA symbols of the MBS regions using the pattern vector, such as the pattern vector (8, 6, 0) depicted at FIG. 3.

At 520, the numbered symbols are assigned, by numbering module 422, to segments. Referring to FIG. 2, the symbol numbers 0-5 are assigned to segment 212A, the symbol numbers 6-9 are assigned to segment 212B, and so forth. By assigning the symbol numbers to segments, the streams and substreams included within segments are also assigned to symbol numbers. For example, symbol numbers 0-9 carry segments 212A and 212B, which include the packets of stream 1 including substreams 1 and 2. Moreover, FIG. 2 depicts that symbol numbers 0-9 are broadcast as a burst (or time slice). As such, a client station interested in accessing only stream 1 including substreams 1 and 2, can receive and decode symbol numbers 0-9 in segments 212A-B and then resume receiving and decoding at symbol numbers 22-31 in segments 212E-F, which may enable a power savings at the client station by receiving and decoding only when required (e.g., not decoding the content associated with symbol numbers 10-21 and the like). In some implementations using IEEE-802.16, the numbering system described herein enables a downlink data burst (e.g., a time slice) to span more than one MBS region.

At 530, the pattern vector is provided by the macrodiversity controller (and/or the numbering module 422) to a client station, such as client station 114A, to enable the client station to access segments comprising streams and substreams of packets. The pattern vector may be included within management messages transmitted from the macrodiversity controller 420 to the client station. For example, numbering module 422 may include the pattern vector in a management message sent to the client station (e.g., as a management message inserted into an MBS region, such as in an MBS map message). Moreover, the base station may provide segment information (e.g., information describing the symbol numbers assigned to each of the segments, including associated streams and substreams).

Figure 6:
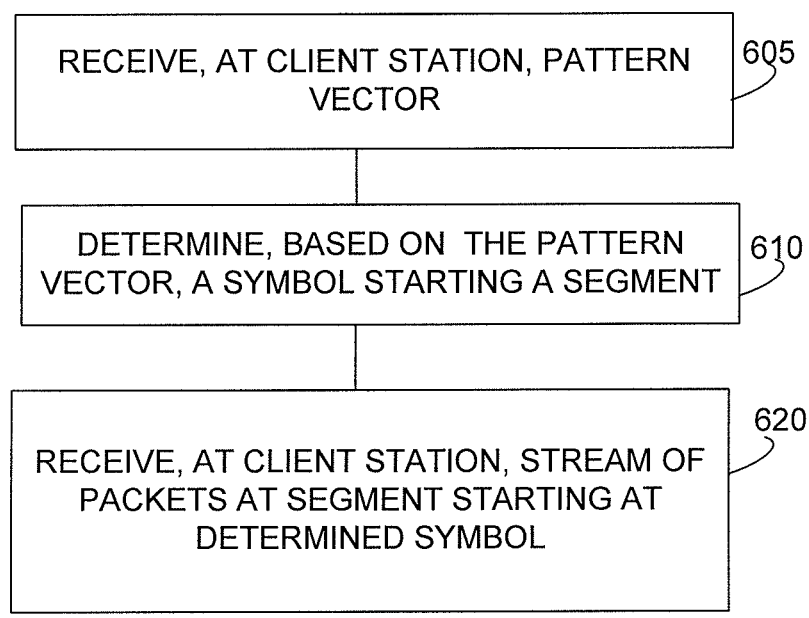
FIG. 6 depicts a process 600 for using, at a client station, the numbering system.
Figure 7:
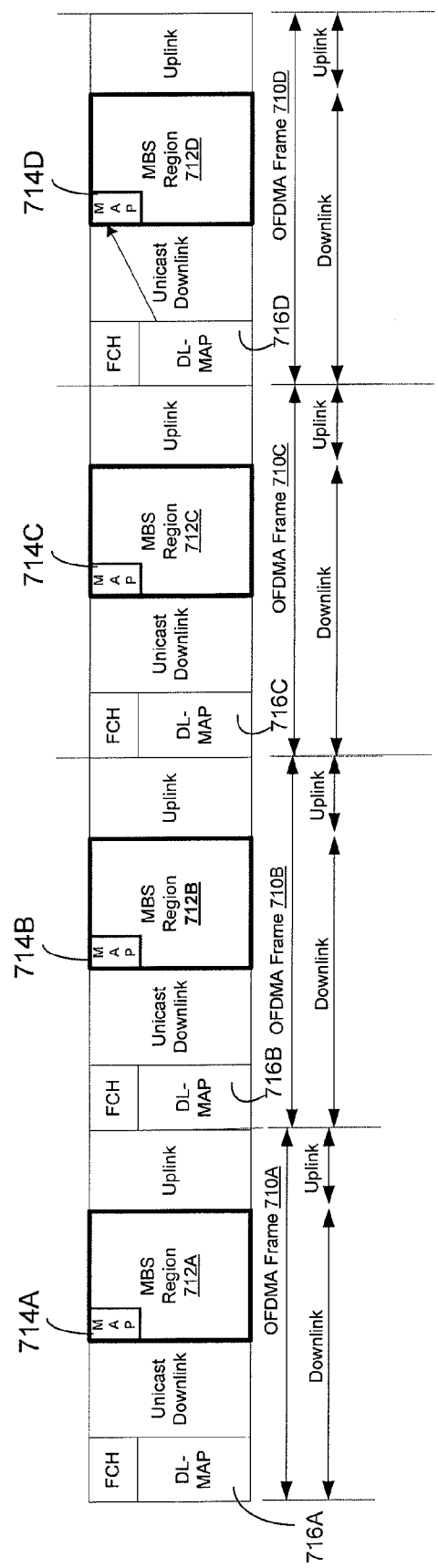
FIG. 7 depicts a block diagram of OFDMA frames consistent with IEEE 802.16.

FIG. 6 depicts a process 600 for using the numbering system at a client station. The description of process 600 will refer to FIGS. 2-4 as well.

At 605, a pattern vector is received at a client station. For example, client station 114A and, in particular, numbering module 425A, may receive a management message including the pattern vector. The management message may be an IEEE 802.16 MBS map included within one of the MBS regions, although the pattern vector may be included in other management messages sent from the base station to the client station.

At 610, the pattern vector may be used to determine the symbol number starting a segment. For example, given the pattern vector (10, 6, 0, 6) for example, numbering module 425A can identify the symbol numbers assigned to MBS regions. Moreover, the client station 114A (and/or numbering module 425A) may receive segment information and the assigned symbol numbers (and thus the location of the segments). Referring to the example of FIG. 2, this segment information may for example indicate a starting symbol number of a segment (e.g., symbol number 14) and a segment length (e.g., an ending symbol number 21). Given the pattern vector (10, 6, 0, 6) for example, the symbol numbers 0-9 can be identified as being assigned to MBS region 230A and the segment information may indicate that segment 212A starts at symbol number zero and ends at symbol number 5. The numbering module 425A of client station 114A can then locate the start of segment 212A. The location of other segments can be identified in a similar manner.

At 620, the client station then receives a stream of packets at a segment starting at the symbol number determined at 610. For example, the numbering module 425A may determine that symbol number 0 of FIG. 2 is the beginning of segment 212A and that segment 212A ends at symbol number 5. The client station thus processes the OFDMA symbols assigned to symbol numbers 0-5 in segment 212A to receive and decode the OFDMA symbols into packets. The packets may provide, for example, a digital video broadcast for presentation at the client station. The client station may also receive a stream of packets from other segments in a similar manner (e.g., symbol 6 is the start of segment 212B, symbol 10 is the start of segment 212C, and so forth).

The above example locating segment 212A is a relatively straight forward case. However, numbering modules 425A-B may each determine, using for example Equations 1-8 below, the location of any symbol and which frame includes that symbol (and thus the start of a segment).

For example, the numbering module 425A at client station 114A may determine a pattern vector based on the following:

$$\vec{l} = (l_1, l_2, \ldots l_K) \quad \text{Equation 1,}$$

wherein $\vec{l}$ represents the pattern vector, $l_1, l_2, \ldots, l_k$ represent the elements of the pattern vector (e.g., the first element, second element, and so forth until the $k^{th}$ element), and $l_k$ represents the last width in OFDMA symbols. For example, $l_1$ represents the width in OFDMA symbols of the first MBS region, $l_2$ represents the width in OFDMA symbols of the second MBS region, and $l_k$ represents the width in OFDMA symbols of the $k^{th}$ MBS region.

To determine the location of a symbol number, D, given the pattern vector, the numbering module 425A at client station 114A may determine another vector, $\vec{L}$, based on the following:

$$\vec{L} = (L_1, L_2, \ldots, L_k) \quad \text{Equation 2,}$$

wherein each of the elements of the vector $\vec{L}$ is determined based on the following equation:

$$L_i = \sum_{j=1}^{i} l_j, \quad \text{Equation 3}$$

wherein j is an index that varies from 1 to the value of i, and i is the element being determined in vector, $\vec{L}$. To illustrate with a numerical example, given the pattern vector $\vec{l}$ (8, 6, 0) depicted at FIG. 3, the vector $\vec{L}$ is equal to (8, 14, 14).

Next, the numbering module 425A at client station 114A may determine the value p based on the following equation:

$$p = \left\lfloor \frac{D}{L_k} \right\rfloor, \quad \text{Equation 4}$$

wherein $L_k$ is the last element of the vector $\vec{L}$, D is the particular symbol number being located, and the function $\lfloor \ \rfloor$ represents that the quotient is rounded down to the nearest integer. Continuing with the above numerical example, given the symbol number to be located D is 31 (see, e.g., symbol number 31 at FIG. 3), the value of p is equal to 2 (e.g., $$\left\lfloor \frac{31}{14} \right\rfloor).$$

Next, the numbering module 425A at client station 114A may determine the smallest values of the variables m and $L_m$, such that the values satisfy the following inequalities:

$$1 \leq m \leq k, \text{ such that } D < pL_k + L_m \quad \text{Equations 5 and 6.}$$

Continuing with the numerical example, m is equal to 1, so that $L_m = L_1 = 8$ (e.g., 31<2(14)+8). Hence, the numbering module 425A at client station 114A determines that the symbol number D is located at the following frame:

$$(pk+m) \quad \text{Equation 7,}$$

wherein the symbol number D is at the $(pk+m)^{th}$ OFDMA frame of the time diversity interval. Continuing with the previous numerical example (which is also depicted at FIG. 3), symbol D (i.e., the $31^{st}$ symbol in this example) is in the $7^{th}$ OFDMA frame (e.g., based on Equation 7, (2×3)+1).

The numbering module 425A may also determine the location of symbol D within the $(pk+m)^{th}$ OFDMA frame based on the following:

$$(D - pL_k - L_{m-1} + 1) \quad \text{Equation 8.}$$

Returning to the previous example, the $31^{st}$ symbol (i.e., D=31), is located in the $7^{th}$ frame as the $4^{th}$ OFDMA symbol within the MBS region in that frame, which is consistent with FIG. 3. Given the pattern vector, the location of any symbol D can be determined (and thus the start of a segment) by numbering modules 425A-B using, for example, Equations 1-8 above.

The subject matter described herein may be embodied in systems, apparatus, methods, and/or articles depending on the desired configuration. In particular, various implementations of the subject matter described (e.g., components of client stations 114A-B, base stations 110A-B, macrodiversity controller 420, numbering modules 425A-B, and numbering module 422) may be realized in digital electronic circuitry, integrated circuitry, specially designed ASICs (application specific integrated circuits), computer hardware, firmware, software, and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. For example, the components client stations 114A-B, base stations 110A-B, macrodiversity controller 420, numbering modules 425A-B, numbering module 422, and aspects of processes 500 and 600 may be realized in digital electronic circuitry, integrated circuitry, specially designed ASICs (application specific integrated circuits), computer hardware, firmware, software (including computer programs), and/or combinations thereof. The numbering module 422 and numbering modules 425A-B are only exemplary components, as the functionality of each of the modules may be implemented as a single module or distributed among a plurality of components of system 400 and/or system 100.

These computer programs (also known as programs, software, software applications, applications, components, or code) include machine instructions for a programmable processor, and may be implemented in a high-level procedural and/or object-oriented programming language, and/or in assembly/machine language. As used herein, the term "machine-readable medium" refers to any computer program product, computer-readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. Similarly, systems are also described herein that may include a processor and a memory coupled to the processor. The memory may include one or more programs that cause the processor to perform one or more of the operations described herein.

Although a few variations have been described in detail above, other modifications or additions are possible. In particular, further features and/or variations may be provided in addition to those set forth herein. For example, the implementations described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Other embodiments may be within the scope of the following claims.

What is claimed is:

1. A method comprising:
generating a plurality of frames in a time diversity interval (TDI), wherein at least two of the plurality of frames include one or more multicast and broadcast service (MBS) regions;
generating a pattern vector, wherein the pattern vector includes one or more values indicating one or more widths of the one or more MBS regions of the TDI, wherein the number of values in the pattern vector represents a period after which the one or more values repeat within the one or more MBS regions of the TDI, such that when the number of frames in the TDI is greater than the number of values in the pattern vector, the one or more widths of the one or more MBS regions repeat in subsequent MBS regions until a last frame in the TDI;
assigning, based on the pattern vector, one or more numbers to one or more symbols of the TDI comprising the plurality of frames;
assigning the one or more symbols with the assigned one or more numbers to one or more segments; and
transmitting, to a client station, the pattern vector to enable the client station to access, based on the one or more symbols with the assigned one or more numbers, at least one segment from at least one of the plurality of frames.

2. The method of claim 1, wherein generating the pattern vector further comprises:
using, as the pattern vector, a first value representing a first width of a first MBS region, a second value representing a second width of a second MBS region, a third value representing a third width of a third MBS region, the first, second, and third MBS regions included within the TDI.

3. The method of claim 1, wherein assigning, based on the pattern vector, one or more numbers further comprises:
numbering each of a plurality of orthogonal frequency division multiple access (OFDMA) symbols of the one or more MBS regions included within the TDI.

4. The method of claim 1, wherein assigning, based on the pattern vector, one or more numbers further comprises:
numbering each of a plurality of orthogonal frequency division multiple access (OFDMA) symbols of the one or more MBS regions included within the TDI without regard to boundaries associated with MBS regions.

5. The method of claim 1, wherein assigning the one or more symbols with the assigned one or more number to the one or more segments further comprises:
assigning a first segment to a portion of the one or more symbols, assigning a second segment to another portion of the one or more symbols, the assignment made without regard to boundaries associated with MBS regions.

6. The method of claim 1 further comprising:
using, as at least one of the one or more segments, a group of numbered orthogonal frequency division multiple access (OFDMA) symbols carrying a stream of packets.

7. The method of claim 1 further comprising:
accessing, based on the pattern vector, the at least one segment by receiving a stream of packets carried by the at least one segment.

8. A device comprising:
a processor;
a memory comprising one or more programs that cause the processor to perform one or more operations;
the processor configured to generate a plurality of frames in a time diversity interval (TDI), wherein at least two of the plurality of frames include one or more multicast and broadcast (MBS) regions;
the processor configured to generate a pattern vector, wherein the pattern vector includes one or more values indicating one or more widths of the one or more MBS regions of the TDI, wherein the number of values in the pattern vector represents a period after which the one or more values repeat within the one or more MBS regions of the TDI, such that when the number of frames in the TDI is greater than the number of values in the pattern vector, the one or more widths of the one or more MBS regions repeat in subsequent MBS regions until a last frame in the TDI; and
a numbering module operated by the processor and configured to assign, based on a pattern vector, one or more numbers to one or more symbols of the TDI comprising the plurality of frames, configured to assign the one or more symbols with the assigned one or more numbers to one or more segments, and configured to provide the pattern vector to enable a client station to access, based on the one or more symbols with the assigned one or more numbers, at least one segment from at least one of the plurality of frames.

9. The device of claim 8, wherein:
the processor is configured to generate the pattern vector by using, as the pattern vector, a first value representing a first width of a first MBS region, a second value representing a second width of a second MBS region, a third value representing a third width of a third MBS region, the first, second, and third MBS regions included within the TDI.

10. The device of claim 8, wherein:
the numbering module is configured to assign, based on the pattern vector, one or more numbers by numbering each of a plurality of orthogonal frequency division multiple access (OFDMA) symbols of the one or more MBS regions included within the TDI.

11. The device of claim 8, wherein:
the numbering module is configured to assign, based on the pattern vector, one or more numbers by numbering each of a plurality of orthogonal frequency division multiple access (OFDMA) symbols of the one or more MBS regions included within the TDI without regard to boundaries associated with MBS regions.

12. The device of claim 8, wherein:
the numbering module is configured to assign a first segment to a portion of the one or more symbols, assign a second segment to another portion of the one or more symbols, the assignment made without regard to boundaries associated with MBS regions.

13. The device of claim 8, wherein at least one of the one or more segments is a group of numbered orthogonal frequency division multiple access (OFDMA) symbols carrying a stream of packets.

14. The device of claim 8, wherein:
the processor is further configured to access, based on the pattern vector, the at least one segment by receiving a stream of packets carried by the at least one segment.

* * * * *